// United States Patent [15] 3,699,396
Colaud et al. [45] Oct. 17, 1972

[54] MOUNTING SYSTEM FOR PRINTED CIRCUIT BOARDS

[72] Inventors: Gerard Colaud, Epinay, Seine; Bernard Fanene, Garges Les Gonesse, both of France

[73] Assignee: Societe Industrielle Honeywell Bull (Societe anonyme), Paris, France

[22] Filed: April 21, 1971

[21] Appl. No.: 136,080

[52] U.S. Cl................317/101 DH, 339/17, 339/176
[51] Int. Cl................................................H02b 1/02
[58] Field of Search.......317/101 DH, 101 CB; 339/17 LM, 339/17 M, 17 L, 176 MP

[56] References Cited

UNITED STATES PATENTS 3,511,385 5/1970 Ayling.................317/101 DH
3,008,113 11/1961 Johnson..............317/101 DH
3,061,182 10/1962 Corrado et al........339/17 LM
3,476,982 11/1969 Bell et al.............317/101 DH
3,193,791 7/1965 Bock et al...........339/176 MP

*Primary Examiner*—David Smith, Jr.
*Attorney*—Ronald T. Reiling, Fred Jacob and Lewis P. Elbinger

[57] ABSTRACT

A mounting for pluggable printed circuit boards, wherein parallel connectors comprising rows of contact elements are attached to a connection panel by back bars having rear portions affixed to the panel and front portion clamping such connectors to respective ones of the rear portions, and wherein guiding grids provide for inserting printed circuit boards into the connectors and maintaining a mutual parallel relationship between boards so inserted.

8 Claims, 19 Drawing Figures

INVENTORS
Gerard Coland
and Bernard Fanine

BY

ATTORNEY

INVENTORS
Gérard Colaud
and Bernard Fanène

BY

ATTORNEY

PRIOR ART

INVENTORS

Gérard Colard and Bernard Fanine

BY

ATTORNEY

INVENTORS
Gérard Coland,
and Bernard Fanini

BY

Louis P. Elbaz [signature]
ATTORNEY

INVENTORS
Gérard Coland
and Bernard Fanin

BY

ATTORNEY

INVENTORS
Gérard Coland
and Bernard Lacire

BY

ATTORNEY

INVENTORS
Gerard Coland
and Bernard Fanine

BY

ATTORNEY

INVENTORS
Gerard Colond
and Bernard Fanine

BY

ATTORNEY

INVENTORS
Gérard Coland
and Bernard Fanin

BY

ATTORNEY

MOUNTING SYSTEM FOR PRINTED CIRCUIT BOARDS

BACKGROUND OF THE INVENTION

The present invention relates to a support mounting and interconnection system for printed circuit boards pluggable into connectors.

In the technology of fabricating electronic equipment and, more particularly, in the fabrication of equipment utilized for the processing of information, wide use is made of electric circuits realized in a form of printed circuit boards. Such boards are designed to be pluggable into connectors which are connected to inter connecting circuits. Such printed circuit boards may or may not be provided with circuit modules.

Requirements of a technical nature quite frequently necessitate utilizing in the same information processing assemblage, mountings especially adapted for receiving printed circuit boards that sometimes exhibit very different dimensional characteristics. In order to satisfy, especially, the requirements of minimum volume, mountings usually have been provided which are specially adapted to the requirements of each case. This, therefore, results in a variety of equipment necessary for fabricating the various mountings, leading to relatively high production costs.

Therefore, it is the object of the present invention to remedy, to a large extent, these disadvantages of the prior art electronic equipment.

SUMMARY OF THE INVENTION

This object is realized by a mounting system which permits of the simple and economical fabrication of a wide range of mountings which are easily adapted for boards wherein the dimensions such as length, width, and thickness can vary over a wide range. The proposed mounting system of the invention enables a broad utilization of standard mounting elements which are very easy to assemble and to disassemble, permitting, if need be, the modifications of a mounting or the rapid replacement of circuit elements or defective or worn connectors.

A mounting system provided in accordance with the instant invention includes at least one row of connectors disposed parallel to each other and affixed to a connection panel, and guiding means adapted for supporting boards having contact pads along one edge thereof. Such mounting system is characterized in being formed of a rigid frame comprising a connection panel and two back bars attached respectively toward two opposite edges of the panel, each such back bar consisting of a rear portion and a front portion. Each back bar comprises at least one lip, by virtue of which the ends of the bodies of the connectors are locked between the rear portion and front portion of a respective back bar when these two portions thereof are clamped together. The mounting further includes two entrance bars and two sides plates, each side plate being attached to the ends of two back bars and two entrance bars for assuring their parallel positioning and required spacing. At least two guiding grids are also provided, the ends of each such grid being engaged respectively in a groove of the front portion of a back bar and a groove of the corresponding entrance bar. Each grid is provided with board guiding grooves perpendicular to the above-mentioned ends thereof, the spacing of these guiding grooves being equal to the spacing distance of the connectors.

In a mounting of this type, the connectors are positioned in the support mounting with a separation determined by an assembling device, between mounting elements comprising open portions which permit the positioning of the connectors with variable spacings determined by the assembling device. Such a mounting of connectors, once so assembled is extremely rugged and presents a remarkable resistance to very severe trials of shock and vibration to the extent that no displacement of the connectors, guiding grids, or boards in the mounting can be determined after test.

BRIEF DESCRIPTION OF THE DRAWINGS

The invention will be described with reference to the accompanying drawing, wherein.

DESCRIPTION OF THE PREFERRED EMBODIMENT

Figure 1:
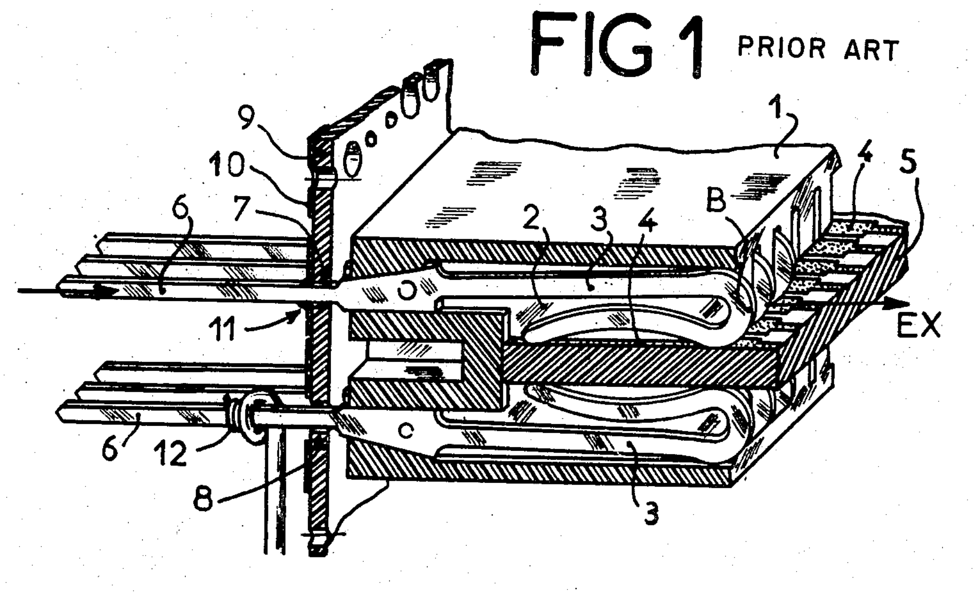
FIG. 1 is a perspective view, partly in section, of a type of connector for use in a mounting system fabricated according to the invention.

The connector for printed circuit boards shown partially in section in FIG. 1 has been described in the French Pat. No. 1,541,094 and the corresponding U.S. Pat. No. 3,543,226, which is assigned to the assignee of the instant invention. In this mounting the connector comprises an insulating body 1 provided with internal sockets 2 adapted for receiving contact elements 3 which are disposed for engaging in contact with contact pads 4 arranged on the opposite faces of one end of a printed circuit board 5 inserted into the connector.

Each contact element 3 is provided with a contact lug 6 intended for passing through a respective one of holes 7, 8 provided in a connection panel 9, which bears printed circuits 10 and is maintained proximate to the connector. Contact lugs 6 of contact elements 3 of the connector may be soldered to the elements of printed circuits 10 of connection panel 9, as shown by reference numeral 11, or may receive wrapped connections 12.

FIGS. 4A — 4D illustrate different views of the insulating body 1 of a connector provided with internal sockets 2 disposed for receiving, for example, 88 contact elements 3 (FIG. 1). Insulating body 1 of the connector is provided at its ends with flanges 13, each of which is provided on its interior face with a guide groove 14 disposed for guiding the front edge of a board during its insertion between the contact elements of the connector. Grooves 14 also function in positioning the connector in an assembling jig, as will be shown hereinafter with reference to FIG. 3, and in positioning board guiding grids in a support mounting, as will be shown with respect to FIGS. 8 and 9A – 9C.

Figure 2:
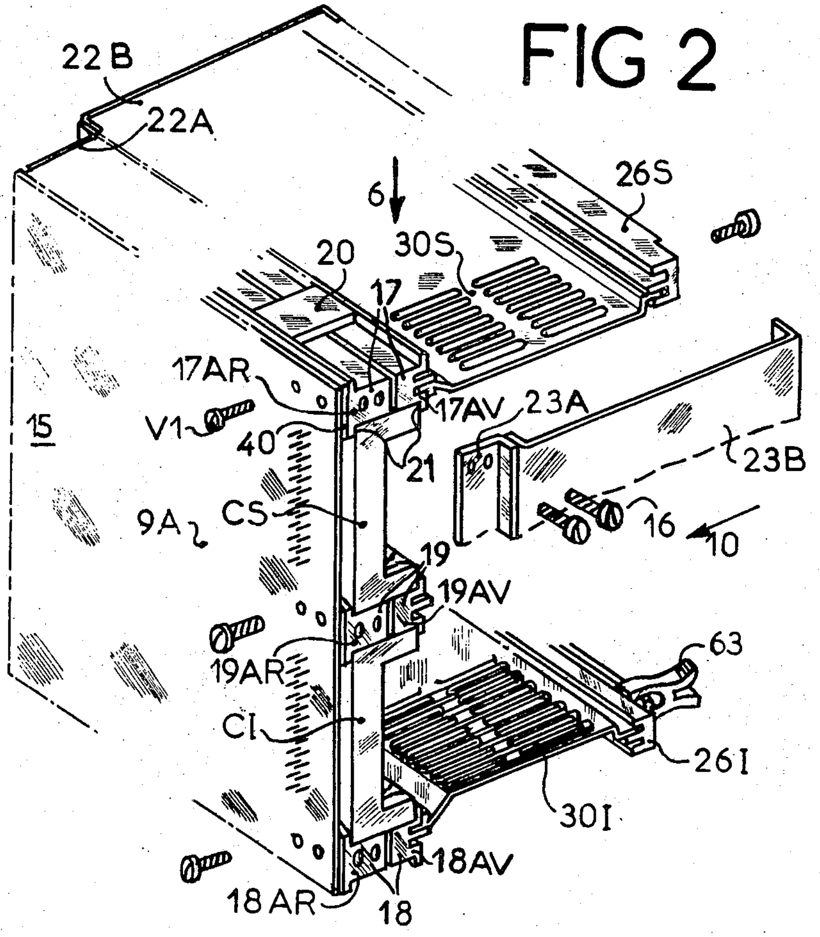
FIG. 2 is a schematic perspective view, partly exploded, of the principal components of a mounting fabricated for receiving double boards having printed circuits thereon.

The mounting, illustrated schematically and partly exploded in FIG. 2, assumes the general form of a box open on one side for the insertion of boards into such mounting. The side opposite to the open side is closed by a rigid frame 15 serving as a back and comprising a connection panel 9A. To the upper part of panel 9A is attached the rear portion 17AR of an upper back bar 17, whereas the rear portion 18AR of a lower back bar 18 is attached to the lower part of the panel. Since the mounting illustrated is adapted for receiving two rows of connectors, a rear portion 19AR of a central back bar 19 is attached to panel 9A between back bars 17 and 18. Each of back bars 17, 18 and 19 comprises a rear portion AR, which is attached to connection panel 9A, and front portion AV, which is attached to the corresponding rear portion, the details of which will be described hereinafter.

The rear portion and the front portion of a back bar are each provided with lips 21 disposed in a manner to be able to lock between them the ends of connectors disposed between two such opposed lips. In FIG. 2, an upper connector row CS is mounted between the lips of the front and rear portions of back bars 17 and 19, whereas a lower connector row CI is mounted between the lips of back bars 18 and 19.

Figure 11:
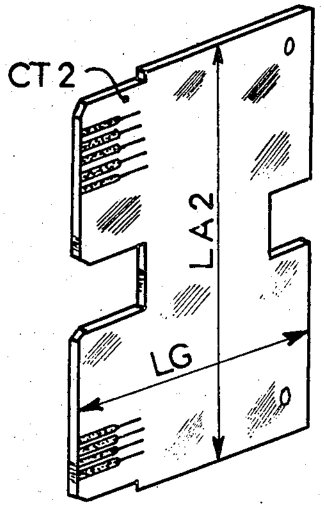
FIG. 11 illustrates a double board for a support mounting fabricated according to the embodiment of FIG. 2.
Figure 7:
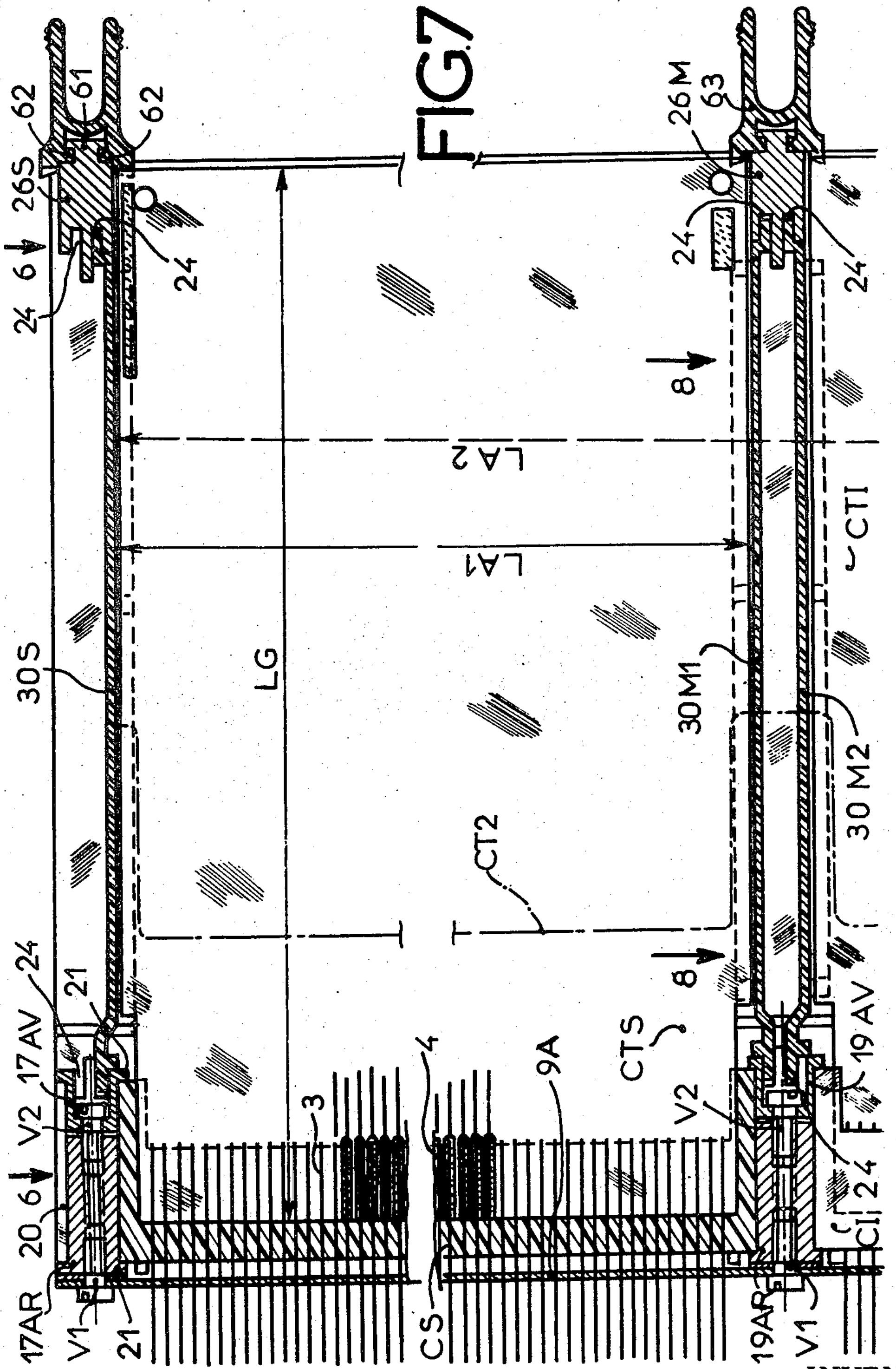
FIG. 7 is a sectional view, taken along lines 7—7 of FIG. 6, of the upper part of a support mounting for receiving two rows of single boards.
Figure 10:
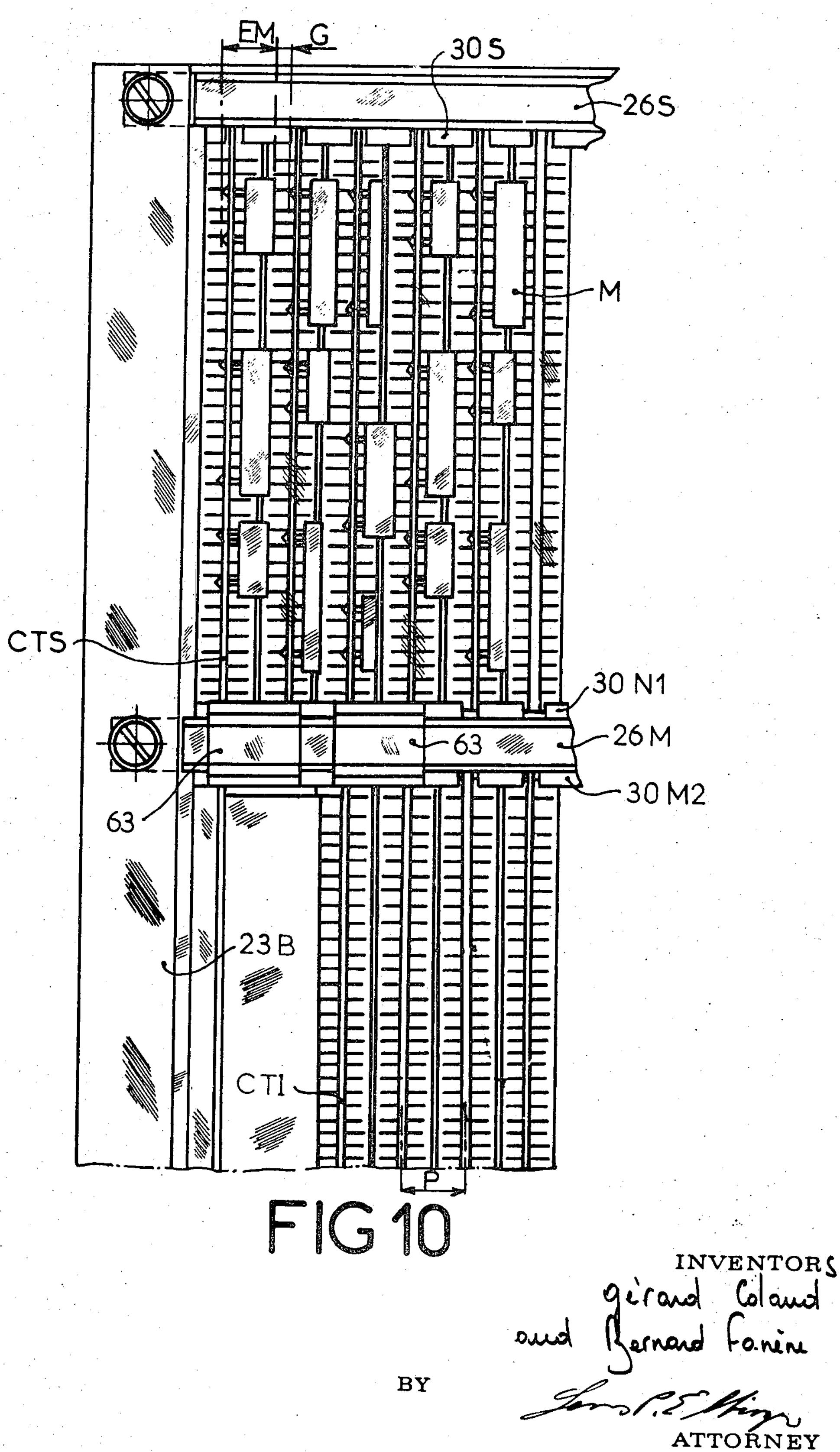
FIG. 10 is a view, in part, of a support mounting, viewed along the direction 10 of FIG. 6.

The mounting shown in FIG. 2 is adapted for receiving a row of boards CT2 of double width, of which an example is shown in FIG. 11, whereas the mounting shown in FIGS. 7 and 10, of which the rigid frame is analogous to that described previously, is adapted for receiving two rows of boards of single width.

Figure 6:
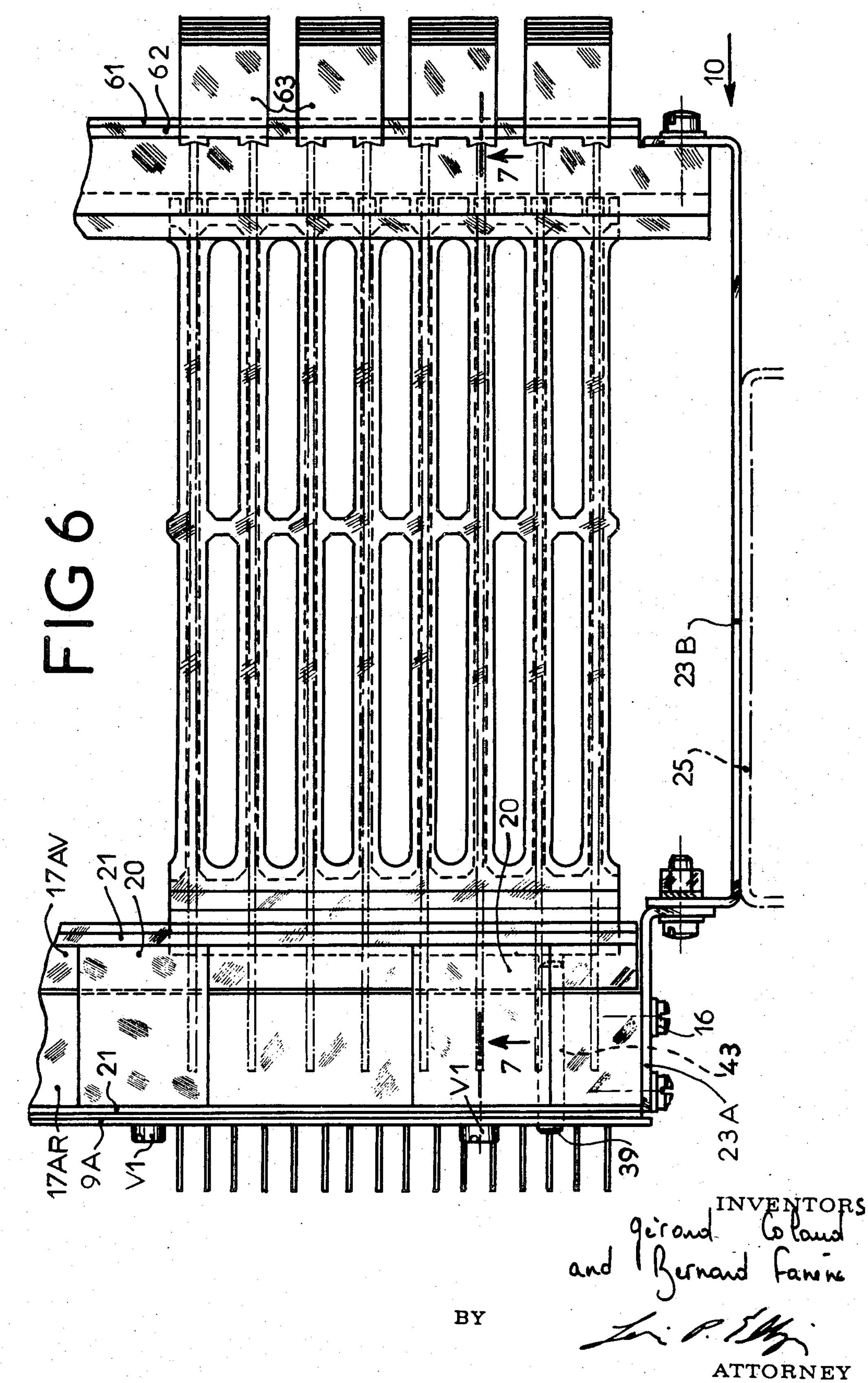
FIG. 6 is a plan view of a portion of a support mounting, viewed along the direction 6 in FIGS. 2 and 7.

FIGS. 6 and 7 illustrate a mounting in which the rear portions 17AR and 19AR of the back bars are attached to connection panel 9A by means of screws V1. The two portions AV and AR of a back bar assembly are joined by screws V2, which also serve to secure the locking of the ends of connectors between lips 21.

The ends of the back bars are attached to two side plates 22 and 23, FIGS. 2 and 6. Each of side plates 22 and 23 comprises two parts. One part 23A, in a shape of an angle iron, once attached to the rear portions AR of the back bars becomes an integral part of the rigid frame 15. The other part 23B is attached at its one edge to a part 23A and at its other edge to two entrance bars 26. Several mountings can be superposed and joined together at their extremities by common posts 25, FIG. 6.

The mounting of FIG. 2 comprises an upper entrance bar 26S and a lower entrance bar 26I. The mounting of FIGS. 7 and 10 is further provided with an entrance bar 26M. The entrance bars assure the spacing and the parallel orientation of the outer faces of the side plates which, in turn, assure the spacing and parallel positioning of the back bars and the entrance bars. The back bars and the entrance bars, FIG. 7, are each provided with two grooves 24 disposed for receiving the opposite ends of board guiding grids 30 (FIGS. 5A – 5D). Each board guiding grid is shaped to exhibit parallel grooves 31 whose spacing is equal to the spacing P of the connectors in the mounting, FIG. 8.

A simplified embodiment of the support mounting may comprise only a single row of connectors disposed for receiving one row of boards of single width; i.e., of a width corresponding to the length of a single connector in the mounting. The arrangement of the elements of such a mounting is readily determined from FIGS. 7 and 10 by considering only the upper half of the mounting which comprises, therefore, only back bars 17 and 19 and entrance bars 26S and 26M.

FIGS. 7 and 10 only show the upper part of a double mounting adapted for receiving an upper row of boards CTS and a lower row of boards CTI, both of length LG and width LA1, FIG. 7. Such a mounting is analogous in part to that of FIG. 2 (for double boards), but comprises, in addition, a central entrance bar 26M disposed for supporting a row of central board guiding grids 30M1 and a row of grids 30M2, provided in addition to the upper row 30S and the lower row 30I, FIGS. 2 and 7. As described previously, the mounting of FIG. 2 is adapted for receiving double boards CT2 of width LA2, FIG. 11.

Figure 4B:
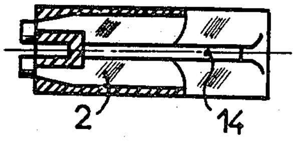
FIGS. 4A, 4B, 4C, and 4D are various views of the insulating body of a connector.
Figure 4D:
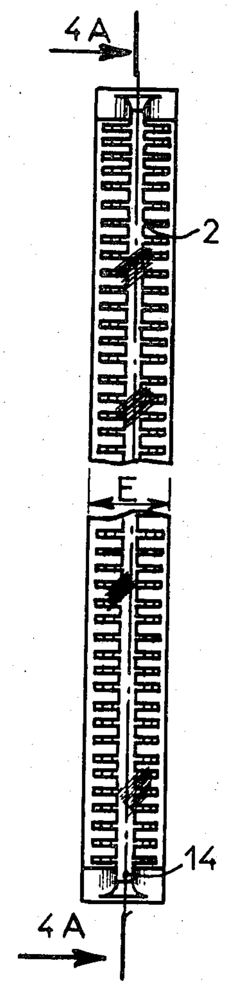
FIG 4 D PRIOR ART
Figure 4A:
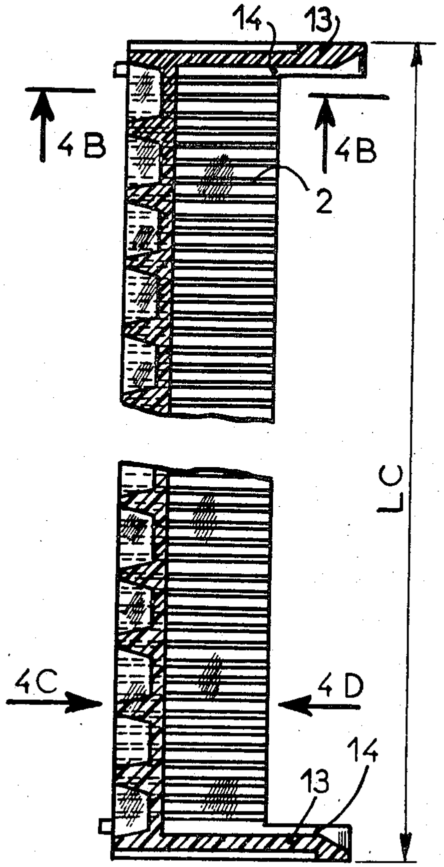
FIG 4A PRIOR ART
Figure 4C:
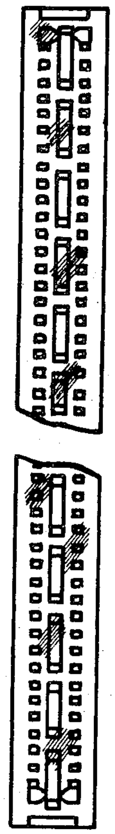
FIG 4C PRIOR ART

The spacing P of the connectors in a row of the mounting is at least equal to the thickness E of the insulating body of a connector, FIG. 4D. However, printed circuit boards may bear circuit modules M which, with the boards, establish a thickness EM, FIG. 10, to which must be added a safety space G between the boards. In a mounting comprising back bars and entrance bars of uniform shape and dimensions, the connectors of a row are usually spaced apart with a spacing P at least equal to the distance EM+G, which may be very much greater than E, FIG. 4D. This spacing may, according to need, differ from one position to another in the same row of connectors. Similarly, with standard type bars, mountings can be fabricated to be adapted for connectors of different widths LC, FIG. 4A, comprising a different number of contact elements, and, therefore, be adapted for boards of width LA1, FIG. 7, or LA2, FIG. 11, which correspond to the connectors. Likewise, boards of different length can be mounted by changing only the length of the board guiding grids and the side plates.

Figure 3:
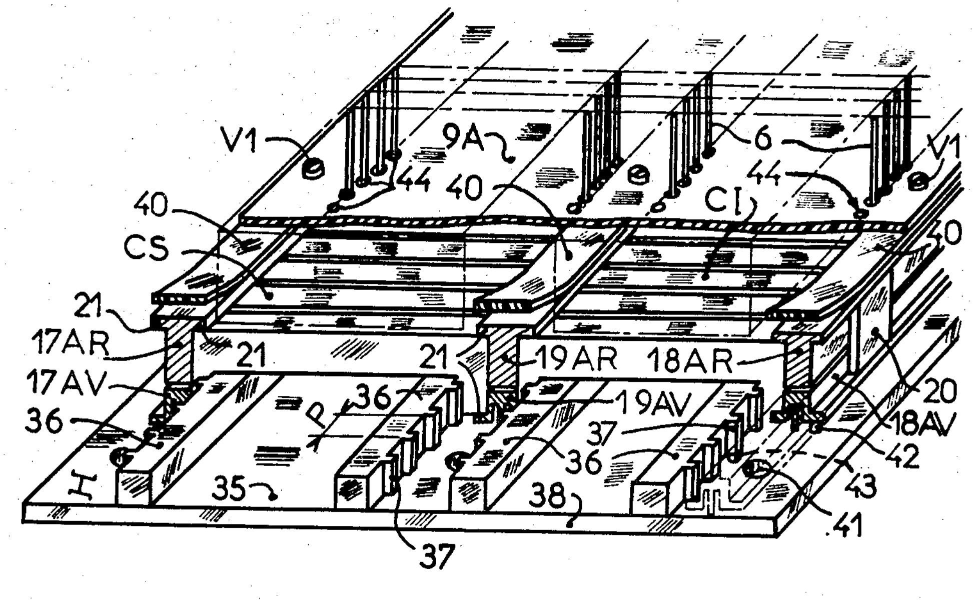
FIG. 3 illustrates a portion of an assembling jig for assembling the components of the rigid frame of a support mounting.

FIG. 3 shows an assembling jig adapted for positioning and fastening the constituent elements of the rigid frame of a support mounting intended for two rows of connectors (FIGS. 2, 7 and 10). Such a mounting may be adapted for accepting single boards as well as double boards. The assembling jig comprises a base plate 35, to which are attached four positioning bars 36. Each bar 36 is provided with teeth 37 on which the grooves 14 of the connector bodies may be engaged (FIGS. 4A, 4B and 4D) to provide for positioning the connector bodies in a row with a spacing P. A reference mark H on base plate 35 denotes the upper position of the support mounting.

To assemble a rigid frame on this assembling jig, the front portions AV of the back bars are first placed along positioning bars 36 by setting them on centering pins 42. One end of each back bar is aligned with the front edge 38 of plate 35 and the other end of each back bar is aligned with the rear edge of plate 35. The connectors are then positioned on the assembling jig, each astride two positioning bars 36 with two teeth 37 engaged in the respective grooves 14 of the flanges of the connectors. Then the rear portions of the back bars 17, 18 and 19 are placed in position.

Centering pins 39, FIG. 6, are engaged in holes 43 provided at the ends of the back bars. Insulating strips 40 are next placed on the back bars, such strips being provided with holes for the passage of pins 39 and screws V1. Subsequently a connection panel 9A is placed in position over the assembly, while passing lugs 6 of the contact elements of the connectors, FIGS. 1 and 3, through holes 44 provided in the connection panel. The screws V1, FIGS. 3, 6 and 7, are engaged in the rear portions AR of the back bars. The screws V2, FIG. 7, are positioned for assembling the rear portions AR to the front portions AV of the back bars by passing these screws through holes 41, FIG. 3, provided in the assembling jig. The angle iron-shaped parts 22A and 23A of side plates 22 and 23 are attached by screws 16 to the ends of the rear portions AR of the back bars, FIGS. 2 and 6, by holding parts 22A and 23A against the edges of plate 35 of the assembling jig, FIG. 3. Before tightening screws V2 which join the front and rear portions of the back bars, FIG. 7, bracing plates 20 are placed between the external lips 21 of the back bars on each side of the mounting, FIGS. 2, 3, 6 and 7, in order to distribute the pressure exerted by screws V2 equally on the ends of the connectors and these bracing plates 20. Following this, all of the assembling screws of the elements of the rigid frame can be progressively tightened.

For reasons of better continuity in assembling, it has been found advantageous to solder contact lugs 6 of the connectors to the ground circuits and to the current supply circuits of the connection panel before withdrawing the rigid frame from its assembling jig. After the rigid frame is withdrawn from the jig, the assembling of the other elements of the support mounting continues; i.e., the assembling of the remainder of the side plates, the entrance bars, and the board guiding grids in the mounting.

Guiding grids 30 are fabricated of an insulating material, which is strong yet flexible, and is provided with board guiding grooves 31, FIGS. 5A, 5B, 5C and 5D, spaced apart by the spacing P of the connectors in the mounting. Each guiding grid 30 is provided with a front edge 32, which is engageable in a groove 24 of a front portion AV of a back bar, and an alignment lip 33, which is oriented parallel to edge 32 and perpendicular to the guiding grooves 31 of the grid.

Figures 5A, 5B, 5C, 5D:
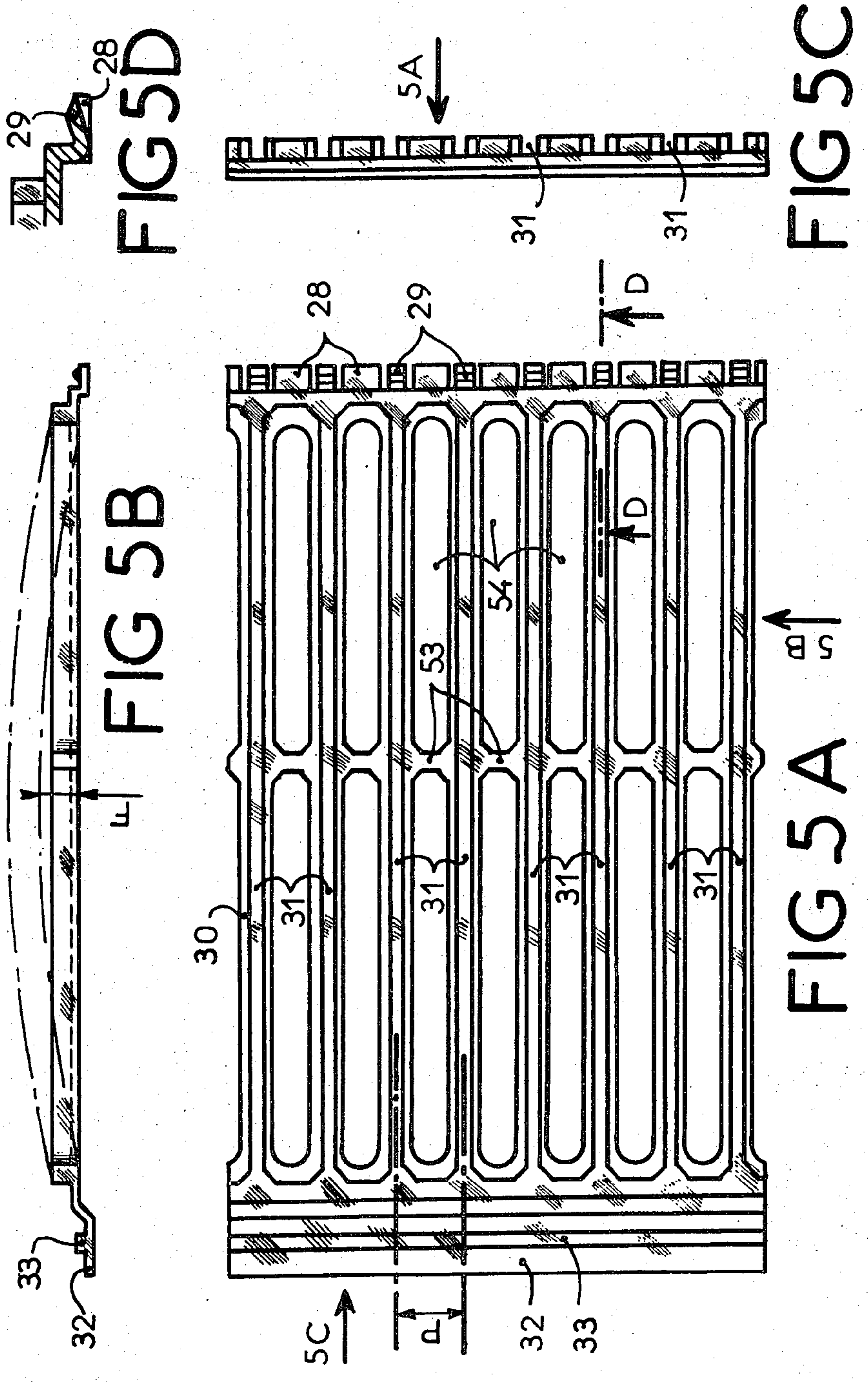
FIGS. 5A, 5B, 5C and 5D are various views of a guiding grid for printed circuit boards.

At its opposite end, guiding grid 30 is provided with an edge comprising a series of alternating tongues 28 and 29. Tongues 28, FIGS. 5A and 5D, are parallel to the plane of the grid, whereas tongues 29 are inclined thereto to exhibit protuberances over the thickness of the edge of the grid, which is engageable by force in a groove 24 of an entrance bar.

The insertion of a board guiding grid 30 in the support mounting is effected manually be means of a pincer tool, FIGS. 8, 9A, and 9B and 9C. This pincer tool comprises an upper arm 45, hinged on a pin 46 to a frame 47, and a lower arm 48, FIGS. 8 and 9C. Lower arm 48 is hinged to frame 47 by a pin 49. Integral with upper arm 45 of the tool is a portion straddling frame 47 and provided with a pressure rod 50.

Frame 47 is provided with two parallel projections 51 which are spaced apart by the distance corresponding to one or more spacing distances of the connectors in the mounting. Each of projections 51 is adapted for engaging partly in a respective one of grooves 31 of a board guiding grid and partly in a respective guiding groove 14 of two connectors positioned in the support mounting. Frame 47 is further provided with two hooks 52, each of which is adapted to catch under a small bar 53 that is disposed crosswise to a grid 30 toward the middle of its length and crosswise to ventilation openings 54, FIG. 8. Projections 51 are joined together by a support plate 55. The lower arm 48, which turns on pin 49, is provided with a projection 56 that is continuously urged against a stop pin 57 by the action of a leaf spring 58, FIG. 9B.

For inserting a board guiding grid in a support mounting, the arms of the pincer tool are separated as far as possible to permit engaging hooks 52 under respective small bars 53. The arms are then brought closer without, however, deforming the grid, and the ends of projections 51 are inserted into guiding grooves 14 of the connectors, FIGS. 8 and 9A. Next, the assembly is pushed forward in order to engage the front edge 32 of the grid in a groove 24 of the front portion of a back bar of the support mounting, until the alignment lip 33 of the grid stops against the edge of groove 24. Arms 45 and 48 are then closed together, FIG. 9B, for bending the grid and bringing the tongues of the grid into engagement with a groove 24 of the corresponding entrance bar. In this operation, a guiding grid of about 16 cm length can be subjected temporarily to a curvature of 10–15 mm, as shown in FIG. 5B by the arrow F. After this, the grid is allowed to straighten and tongues 28 and 29 enter the groove 24 of the entrance bar. For assuring a complete and forceful engagement of these tongues in the groove, arm 48 of the pincer tool is depressed in the direction of arrow T, FIG. 9C. With such movement, an integral portion 60 of arm 48 thrusts against a flange 61 of the entrance bar, and as support plate 55 is pressing on the edges 59 of ventilation openings 54, FIG. 8, a complete engagement of the tongues in the groove is assured. Arms 45 and 48 of the pincer tool are then separated for disengaging the pincer tool from the grid.

After the board guiding grids have been inserted into the support mounting, printed circuit boards CTS–CTI or CT2, according to the mounting, may be inserted into the guiding grooves and pushed to the rear between the contact elements 3 of the connectors.

Figure 8:
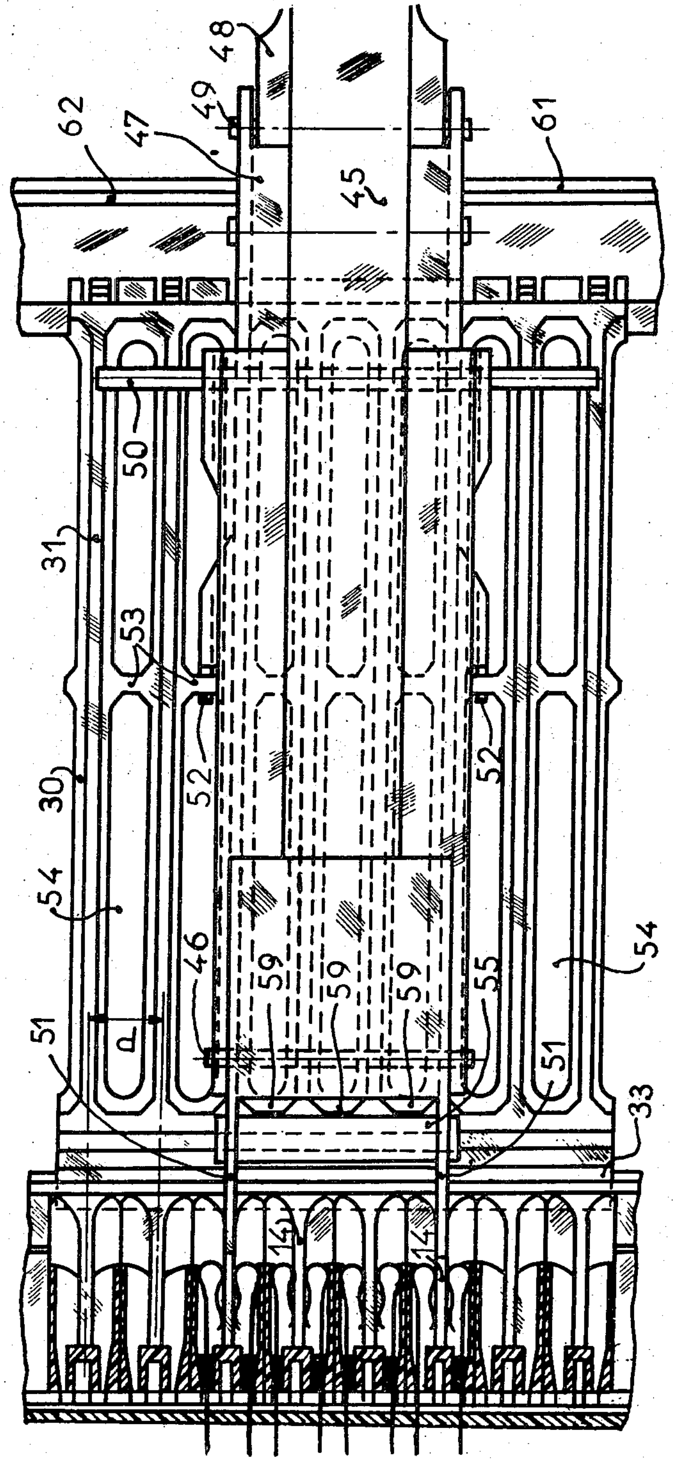
FIG. 8 is a plan view of the inserting of a guiding grid in a support mounting by means of a pincer tool.
Figure 9A:
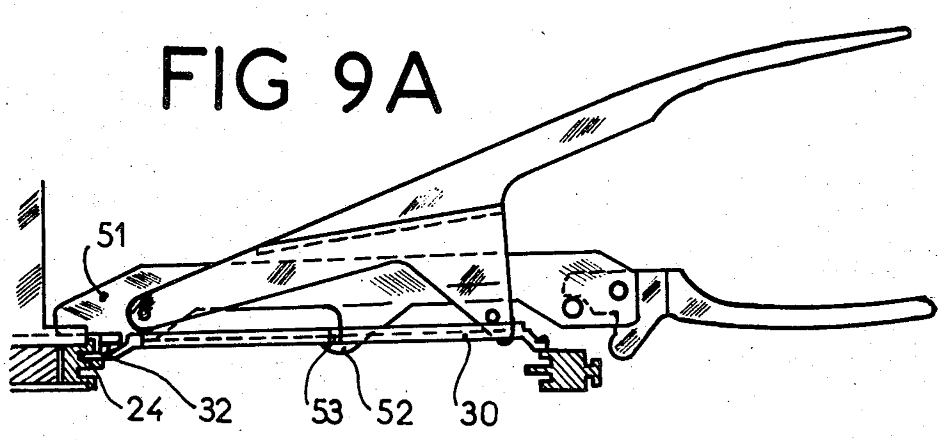
FIGS. 9A, 9B, and 9C illustrate different phases in the inserting of a board guiding grid.
Figure 9B:
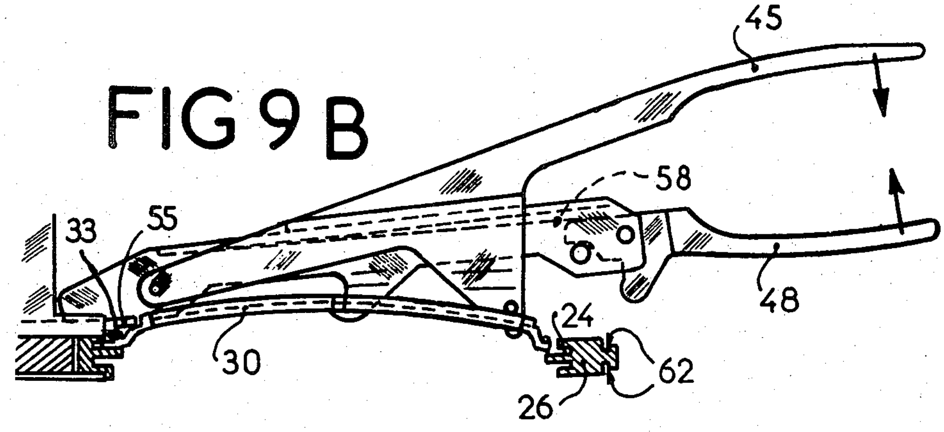
Figure 9C:
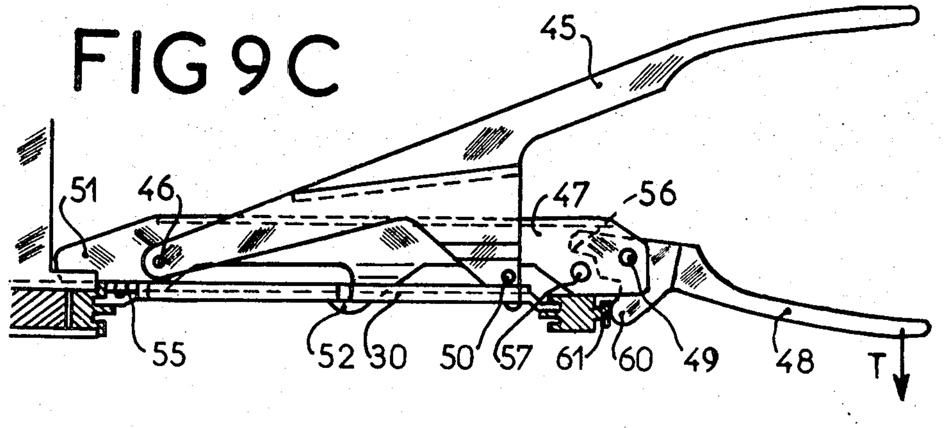

For maintaining the boards in place in the mounting, in spite of shocks and vibrations, the flange 61 of each entrance bar is provided with lateral grooves 62, FIGS. 6, 7 and 8. Grooves 62 are disposed for receiving the lips of locking clamps 63 which are of a flexible plastic material, FIGS. 2, 6, 7 and 10. Each locking clamp 63 is adapted for retaining a corner of each of two or four printed circuit boards in the mounting support. In addition, the grooves 24 provided in the front portion of the back bars, and which receive the guiding grids, are slightly displaced, FIG. 7, in relation to the axes of such bars and, consequently, in relation to the openings of the connectors, for preventing boards, for example, boards not provided with circuit modules, from being inserted upside down in the support mounting.

The entrance bars are positioned on the side plates so that the grooves 24 thereof are in correspondence with the grooves 24 of the back bars which face them in the mounting.

From the embodiments which have been described herein for illustrating the invention, it is apparent that back bars and entrance bars of corresponding dimensions can be utilized, without modification, in mountings in which the spacing of the connectors and their length can be different and also can be utilized in mountings fabricated for boards of different lengths, whether they are single boards or double boards. Board guiding grids of a similar type can be utilized with connectors and boards of different widths. Connectors of a similar type can be utilized, without modification, in mountings adapted for single boards or double boards, boards of different lengths, or boards provided with modules of different thicknesses by changing only the spacing of the connectors according to such thicknesses.

As it has been described herein, a mounting support fabricated according to the instant invention also permits servicing which is simple and economical of material. Thus, for replacing one or more defective contact elements in an assembly, which is very important, it suffices to separate only the lug of the contact element of the defective contact from all electrical connection with the connection panel or with wrapped connections thereof. The printed circuit boards in the vicinity to the element to be replaced are readily withdrawn from the support mounting. Then the defective contact element 3 is extracted from its connector, either by grasping the part B of such contact element FIG. 1, with a pliers and exerting sufficient traction in the direction of the arrow EX, or by pushing on the lug 6 of such contact element in the same direction if part B is recessed in the insulating body of the connector. A new contact element is then positioned and locked in its socket by exerting traction on the contact lug thereof passing through the connection panel. Thus the flexible arm of the new contact element is not subjected to any mechanical strain at the time of its emplacement and, therefore, there is no risk of its being deformed.

In the rare situation where it may become necessary to replace one or more adjacent connectors in a mounting, it is neither necessary to remove the mounting from the assemblage of which it is a part or to disconnect the contact elements of other connectors. It suffices to remove only those boards and the board grids cooperating with the back bars which hold such connector in the mounting. When the aforementioned back bars have been disassembled and the contact elements of the connector have been disconnected, the defective connector can be replaced. Then the connections of the mounting are restored. In the event where it is desired to reduce the mounting time required for replacing a connector, the front portion of each back bar may consist of several sections placed end-to-end and attached to the same rear portion of the back bar. In this instance, the disassembling is reduced to merely removing the boards and the board grids cooperating with the front section of the back bars related to such connector. The removal of these sections permits the replacement of the connector without additional dismantling.

It is evident that the arrangements described herein are not limiting, and that all modification and adaptations of the elements of the mountings can be provided pursuant to the types of connectors and the means of interconnection utilized without departing from the invention.

What is claimed is:

1. A mounting system for pluggable printed circuit boards having at least one row of connectors disposed parallel to each other and affixed to a connection panel and having guiding means adapted for supporting boards provided with contact pads along one edge thereof, wherein said mounting system is characterized by being formed of a rigid frame comprising:

a connection panel;

a pair of back bars attached respectively to one face of said panel near two opposite edges thereof, each of said back bars comprising a rear portion and a separate front portion each extending over said connector ends and maintaining said connector against movement in the endwise direction, each of said bars comprising at least one lip for locking the ends of the bodies of said connectors between the corresponding rear portion and front portion when said rear and front portions are clamped together, and said front portion having a front facing groove formed therein;

a pair of entrance bars each having a rear facing groove formed therein;

a pair of side plates, each of said plates being attached to the ends of said back bars and entrance bars for assuring the parallel positioning and required spacing of said bars; and at least two guiding grids, the ends of each of said grids being engaged respectively in a groove of one of said front portions and an opposite facing groove of a corresponding entrance bar, each of said grids being provided with board guiding grooves oriented perpendicular to said grid ends, the spacing of said guiding grooves being equal to the spacing of said connectors.

2. The mounting system of claim 1 adapted for the mounting of two series of superposed boards, wherein said rigid frame further comprises:

a central back bar attached to said panel between the others of said pair of back bars, thereby permitting the attachment of two series of connectors, a central entrance bar attached to said side plates between the others of said pair of entrance bars, and two series of guiding grids, wherein the ends thereof are engaged respectively in opposite facing grooves of said central back bar and said central entrance bar.

3. The mounting system of claim 1 adapted for mounting pluggable boards of substantially double width, wherein said connection panel is of increased width and a central back bar is mounted on said board between the others of said pair of back bars, wherein the rear portion and the front portion of each of said back bars lock two series of connectors.

4. The mounting system of claim 2, wherein the section of all of said back bars are alike relative to said lips for locking said connectors and relative to said grooves for receiving the ends of said guiding grids.

5. The mounting system of claim 3, wherein the section of all of said back bars are alike relative to said lips for locking said connectors and relative to said grooves for receiving the ends of said guiding grids.

6. The mounting system of claim 2, wherein each of said guiding grids comprises a material which is strong, yet flexible, and is dimensioned such that the ends of said grid may be engaged in the correspinding grooves of one of said front portions and an entrance bar when said grid is bent with sufficient deflection.

7. The mounting system of claim 6, wherein one edge of one of the ends of said guiding grid consists of a series of separated tongues, alternate ones of said tongues being parallel to the plane of said grid and the other tongues being inclined to provide protuberances, and wherein said end is inserted forcibly into a groove which holds it.

8. The mounting system of claim 6, wherein the body of each of said guiding grids is provided with openings disposed between said guiding grooves for providing ventilation of the mounting system when the cards are plugged in.

* * * * *